United States Patent
Ko et al.

(10) Patent No.: US 7,759,957 B2
(45) Date of Patent: *Jul. 20, 2010

(54) METHOD FOR FABRICATING A TEST STRUCTURE

(75) Inventors: Wen-Hsiung Ko, Taichung County (TW); Wen-Chun Chang, Hsinchu (TW); Kuan-Cheng Su, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 26 days.

This patent is subject to a terminal disclaimer.

(21) Appl. No.: 11/829,104

(22) Filed: Jul. 27, 2007

(65) Prior Publication Data
US 2009/0027074 A1    Jan. 29, 2009

(51) Int. Cl.
*G01R 31/02* (2006.01)
*H01L 21/66* (2006.01)
(52) U.S. Cl. .................... 324/763; 324/158.1
(58) Field of Classification Search ........................ None
See application file for complete search history.

(56) References Cited
U.S. PATENT DOCUMENTS

| | | | |
|---|---|---|---|
| 5,239,270 A * | 8/1993 | Desbiens ............... | 324/719 |
| 5,260,668 A * | 11/1993 | Mallory et al. ............... | 324/719 |
| 5,786,608 A | 7/1998 | Lescouzeres et al. | |
| 5,951,893 A | 9/1999 | Bitko et al. | |
| 6,255,677 B1 | 7/2001 | Caillat et al. | |
| 6,282,679 B1 | 8/2001 | Lee | |
| 6,348,808 B1 | 2/2002 | Yakura | |
| 6,440,790 B1 * | 8/2002 | Ishida ......................... | 438/238 |
| 6,486,692 B1 | 11/2002 | Chen | |
| 6,873,170 B2 * | 3/2005 | Asam et al. .................. | 324/765 |
| 2003/0178403 A1 * | 9/2003 | Lemmerhirt et al. ........ | 219/209 |
| 2003/0213785 A1 * | 11/2003 | Zehavi et al. .......... | 219/121.63 |
| 2004/0124865 A1 * | 7/2004 | Chuang et al. .............. | 324/760 |

FOREIGN PATENT DOCUMENTS

GB    2253090 A    *    8/1992

* cited by examiner

*Primary Examiner*—Vinh P Nguyen
(74) *Attorney, Agent, or Firm*—Winston Hsu

(57) ABSTRACT

A method for fabricating a test structure, in which, a heating plate is formed on the wafer for heating a structure to be tested positioned above or adjacent to the heating plate. The heating plate produces heat by electrically connecting to a current. Thus, the heat provided by the heating plate and the electric input/output into/from the structure to be tested are controlled separately and not influenced each other.

8 Claims, 10 Drawing Sheets

METHOD FOR FABRICATING A TEST STRUCTURE

BACKGROUND OF THE INVENTION

1. Field of the Invention

The present invention relates to a test structure and a test method utilizing the test structure, and, particularly, to a test structure and a test method for wafer level reliability (WLR).

2. Description of the Prior Art

In a semiconductor manufacturing industry, the lifetime test can be generally categorized into two types, called "product reliability" and "process reliability" respectively. The product reliability means that a produced and preliminarily packaged chip is tested in a high temperature, a high pressure and a high humidity state for obtaining the lifetime. The process reliability means that a preliminarily produced semiconductor element is subjected to a lifetime test aimed at a semiconductor element material for ensuring no reliability problems in a successive process.

The reliability test methods in a semiconductor manufacturing industry can be also categorized into two types, "Wafer-Level Reliability (WLR)" and "Package-Level Reliability (PLR)". The differences between the two test types include that, in the former, the wafer is directly placed in a test machine on a common producing line for a test, and, in the latter, the wafer must be cut into chips and the chips are packaged to form test samples (device under test, DUT), then the samples are socketed into a burn-in board and placed in a high temperature oven (such as up to 350° C.) for a test. The WLR method is generally fast and direct. In the WLR method, the test result can be obtained in a very short time, not after packing, to determine the reliability of the given wafer for subsequent improvements or processes. While, the PLR method needs a long test time. If the test result is not satisfied, it often takes a long time to obtain a next test result, due to the time consumed for packing and re-testing the further modified product.

One of basic reliability tests is the electron migration (EM) test. The EM means that when a conducting wire (e.g. an aluminum wire) connecting transistors is provided with a current for a long time, the aluminum atoms are moved from a negative electrode to a positive electrode by an electron wind force. A depletion of the aluminum atoms in the negative electrode occurs to cause the circuit to open, or a stacking of the aluminum atoms in the positive electrode occur to cause the circuit to short. As time goes on, the aforementioned conditions become serious and finally the integrated circuit doesn't operate. Hence, the EM test is a basic and important test item.

A traditional EM test of a metal is carried out by PLR, in which the test conditions are close to the use condition of the metal, and is widely accepted in the semiconductor industry. Nevertheless, if the test time of PLR-EM test can be shorten with the WLR-EM test, it will be a great help to shorten the manufacturing time. However, such EM test is not generally used in the industry, and the main reason is that some arguments are still pending. First, with respect to the failure mechanism of EM, since the test current density in EM is very high (for example, 60 to 70 mA) and may be ten-folds of that used in the traditional PLR-test, the aluminum wire may be melted away and open due to the high temperature, but not EM. Second, whether the results of WLR-EM test and the traditional PLR-EM test are in good correlation. If the correlation is poor, the test result of WRL-EM may not be correct.

Therefore, there is still a need for a better wafer level test structure and a better wafer level test method for conveniently obtaining test results.

SUMMARY OF THE INVENTION

One objective of the present invention is to provide a test structure and a test method, in which the current needed in an electric properties test of a structure to be tested and the heat needed for the test are applied separately, and, in addition, the electric properties test can be performed directly on the wafer before the element is packed. Thus, the test result may be obtained promptly.

According to the objective describe above, the test structure of the present invention comprises a heating plate and a structure to be tested. The heating plate is disposed on a wafer for heating when provided with an electric current. The structure to be tested is disposed above or adjacent to the heating plate, wherein the structure to be tested is heated when the heating plate heats.

The test method according to the present invention comprises steps as follows. First, a heating plate is formed on a wafer. Next, a structure to be tested is formed above or adjacent to the heating plate. Thereafter, a voltage is applied to the heating plate thereby to heat the structure to be tested for performing a test.

The method for wafer level electron migration test for a metal line structure according to the present invention comprises steps as follows. First, a heating plate is formed under a metal line structure. Next, parameters for the metal line structure are set, and the parameters comprise a thermal coefficient of resistance, a stress temperature, a stress current, and failure criteria. The initial resistance of the metal line structure and the initial resistance of the heating plate are measured. Thereafter, a voltage is applied to the heating plate thereby to allow the temperature of the metal line structure to reach the stress temperature. A constant current is applied to the metal line structure, wherein the constant current is the stress current. The resistance of the metal line structure is measured and the joule heat produced due to the stress current is calculated. When the failure criteria are accomplished, the constant current is stopped applying to the metal line structure and the time passed during applying the constant current is recorded.

The method of wafer level time dependent dielectric breakdown according to the present invention comprises steps as follows. First, a heating plate is formed under a patterned dielectric layer. Next, a voltage is applied to the heating plate thereby to heat the patterned dielectric layer to reach a stress temperature. A voltage is applied to the patterned dielectric layer. Thereafter, the leakage current of the patterned dielectric layer is measured. The time passed during applying the voltage to the patterned dielectric layer is recorded when the leakage current reaches a predetermined value.

The method of testing negative bias temperature instability of a PMOS (P-type metal-oxide-semiconductor) transistor according to the present invention comprises steps as follows. First, a heating plate is formed adjacent to a source/drain of a PMOS transistor. A voltage is applied to the heating plate thereby to heat the source/drain to reach a stress temperature. A stress voltage is applied to the PMOS transistor. A change of initial resistance of the PMOS transistor is measured.

In the test structure and the test method according to the present invention, the structure to be tested is heated through a heating plate, that is, the current needed for the electric properties test for the structure to be tested and the heat needed during the test may be offered separately, and furthermore, the heating plate and the structure to be tested can be made in a same semiconductor manufacturing process without the need of extra manufacturing steps. In addition, the test can be carried out directly on the wafer before the products are cut and packed, and accordingly, the test result can be obtained promptly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The test structure 10 according to the present invention may be formed on a wafer, and particularly on a scribe line of a wafer. In view of the above description, the test structure 10 may be made simultaneously with the semiconductor elements in the same manufacturing steps of a semiconductor manufacturing process and material used therein, without a need of additional steps or material. FIG. 10 schematically shows that the test structure 34 according to the present invention is formed on a scribe line 36 of a wafer 38. The test structure 34 includes a heating plate 40 formed on the scribe line 36 and a structure to be tested 42 on the heating plate 40.

DETAILED DESCRIPTION

The test structure according to the present invention comprises a heating plate and a structure to be tested. The heating plate is disposed on a wafer for heating when provided with an electric current. The structure to be tested is disposed above or adjacent to the heating plate, and thereby the structure to be tested is heated when the heating plate heats.

Figure 1:
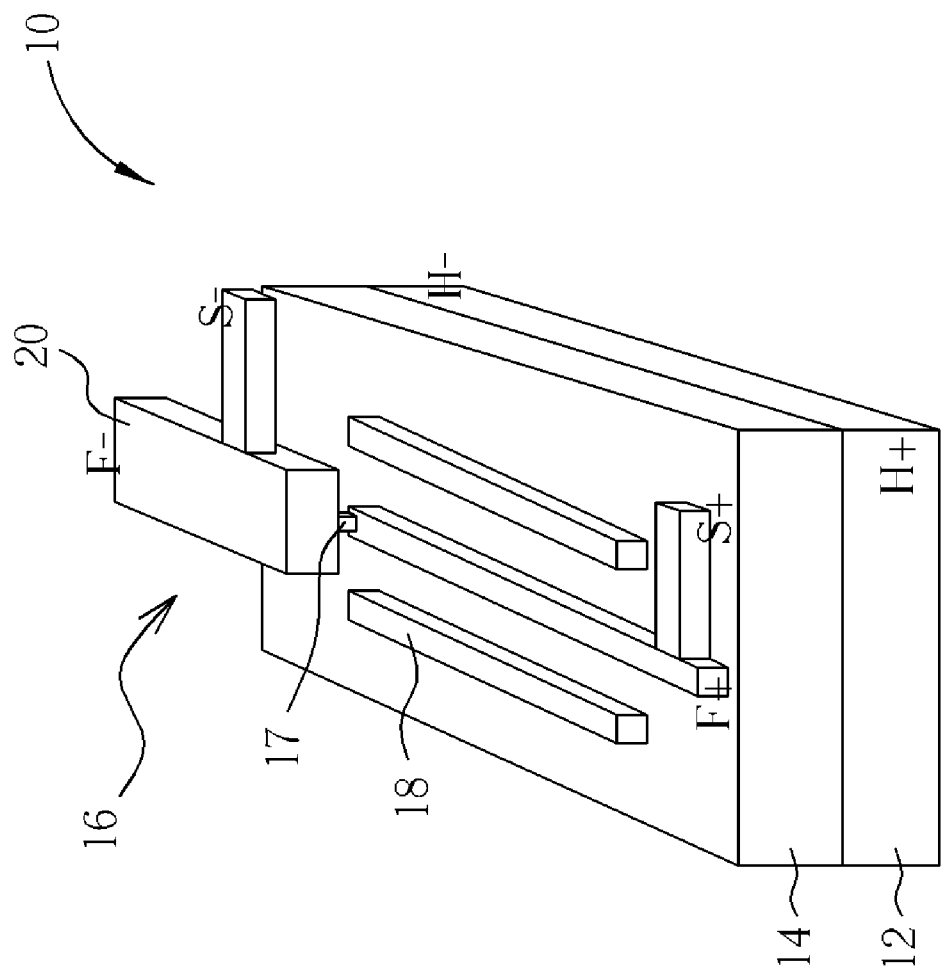
FIGS. 1 to 3 are diagrams showing a wafer level test structure in an embodiment according to the present invention.
Figure 2:
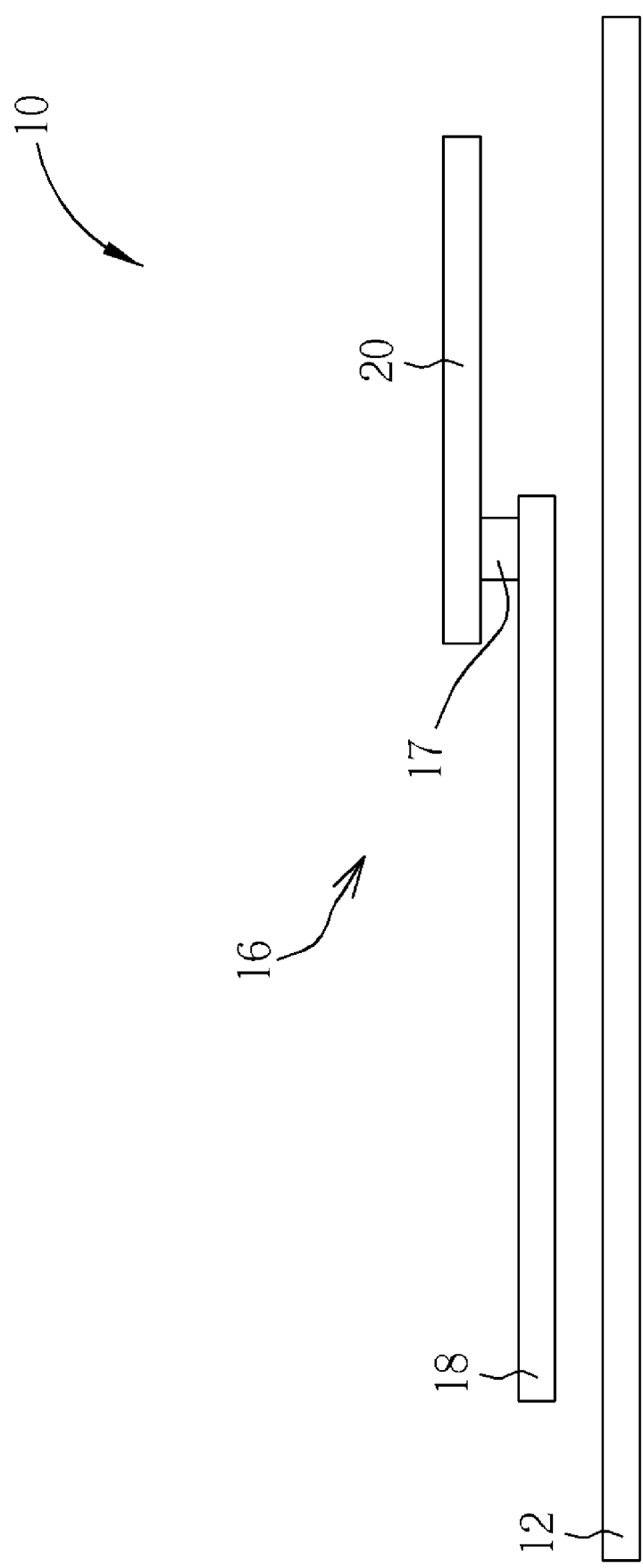
Figure 3:
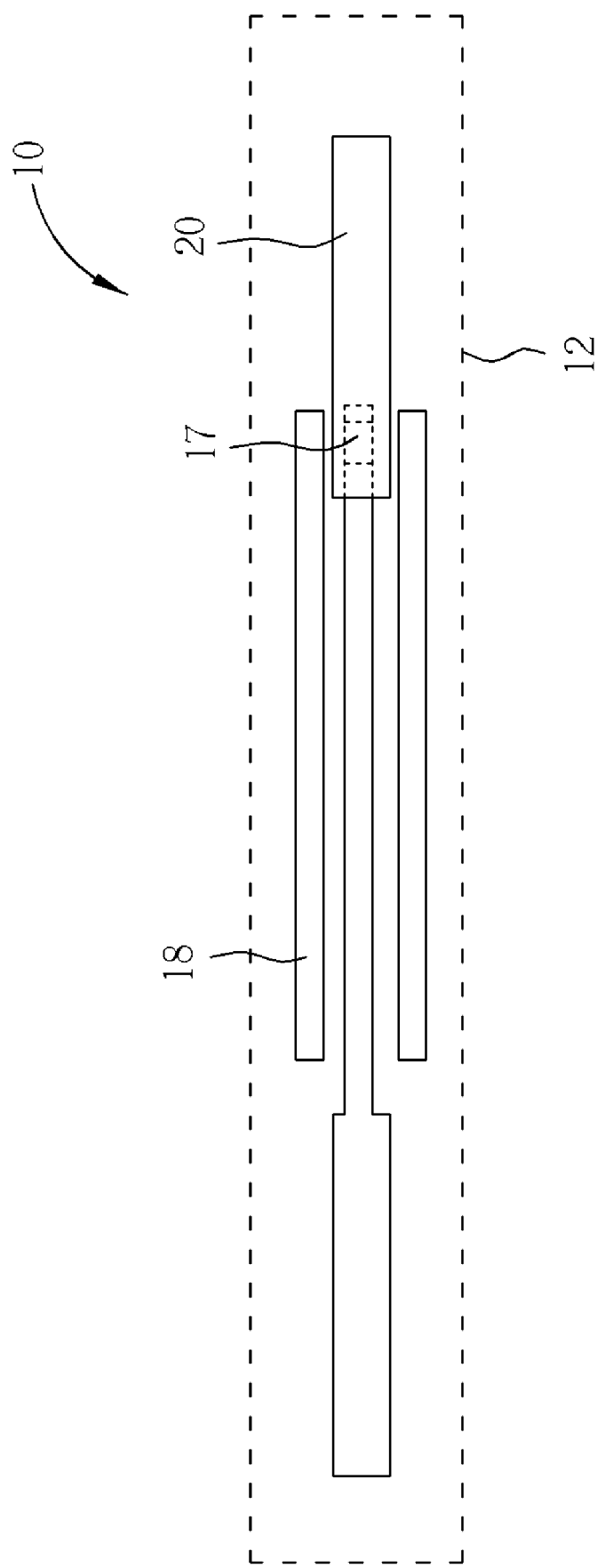

Please refer to FIGS. 1 to 3. FIGS. 1 to 3 are diagrams showing a wafer level test structure in an embodiment according to the present invention. FIG. 1 is a schematically perspective view of the wafer level test structure 10. FIG. 2 is a schematically cross-sectional view of the wafer level test structure 10. FIG. 3 is a schematically top view of the wafer level test structure 10. The test structure 10 according to the present invention may be a wafer level test structure disposed on a wafer substrate (not shown). The test structure 10 according to the present invention comprises a heating plate 12 and a structure to be tested 16.

The heating plate 12 serves as a heater for heating the structure to be tested by means of producing heat directly in the wafer, instead of an oven indirectly used in a traditional technique to heat the structure to be tested. The heating plate 12 may comprise for example a polysilicon layer or a doped silicon layer. The polysilicon layer may be, for example, an N-type doped or P-type doped polysilicon layer. The N-type doping will produce negative charges, and the P-type doping will produce positive charges, such that the resistance of the heating plate may be adjusted by the species and the concentration of the dopants, and the desired heating temperature can be attained. The P-type dopants may be, for example, atoms of Group IIIA, such as boron or $BF^{2+}$. The N-type dopants may be, for example, atoms of Group VA, such as phosphorous or arsenic. The polysilicon also may be a metal polycide layer formed from a salicide (self-aligned suicide) process. The doped silicon layer may be N-type doped or P-type doped. The doped silicon layer also may be a metal suicide layer formed by a salicide process. The polysilicon layer, which is not a metal polycide, or the doped silicon layer has a relatively high resistance and it may result in a better temperature controlled. For example, N-type doped polysilicon layer, P-type doped polysilicon layer, and P-type doped silicon layer (width=20 μm) have a maximal resistance of 100, 240, and 95 Ohm/□, respectively. And, N-type doped metal suicide layer (width=0.12 μm), P-type doped metal suicide layer (width=0.12 μm), N-type doped metal polycide layer (width=0.08 μm), and P-type doped metal polycide layer (width=0.08 μm) may have a maximal resistance of 14, 14, 23, and 20 Ohm/□, respectively.

Figure 4:
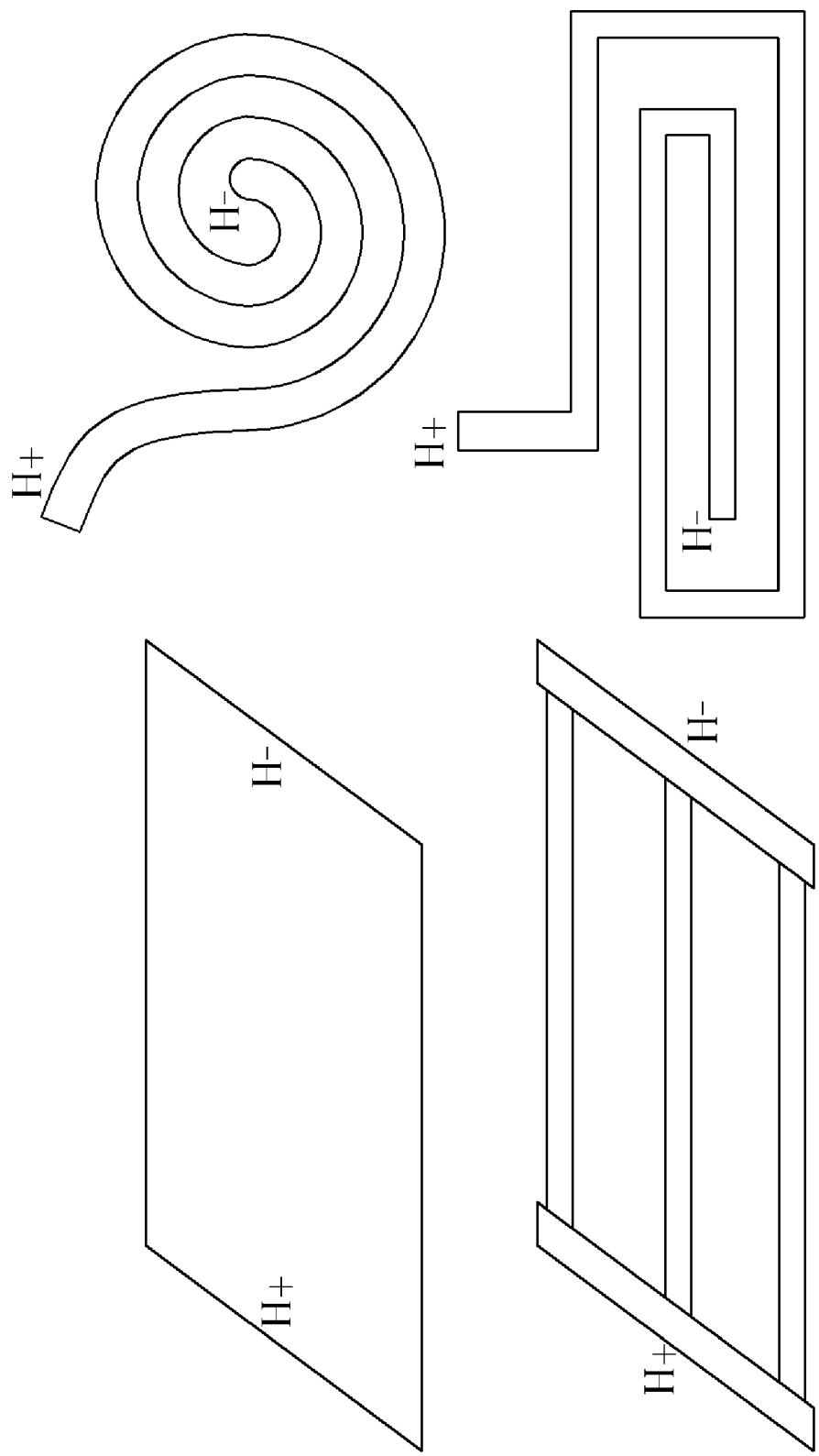
FIG. 4 shows examples of the shape of the heating plate used in the present invention.

The heating plate 12 may produce heat to perform a heating process due to its resistance and a current passing therethrough by the application of a voltage. As shown in FIG. 1, both ends (such as the two ends, H+ and H−, shown in the drawings) of the heating plate 12 may be taken as positive and negative electrodes for the application of a voltage. The shape of the heating plate 12 may be a shape of a block (for example, triangle, square, rectangle, polygon, irregular shape), a spiral (such as a triangular spiral, a squared spiral, a rectangular spiral, a polygonal spiral, an irregular spiral, a round spiral, and the like), a circle, or multi-stripes. Some examples are shown in FIG. 4.

The structure to be tested 16 is formed above or adjacent to the heating plate 12. In case the structure to be tested 16 is electrically conductive, an insulation layer 14 is preferably disposed between the heating plate 12 and the structure to be tested 16 for insulating one from the other. The structure to be tested 16 may be a metal layer. The metal layer may be for example a metal interconnect. The structure to be tested 16 also may comprise a first metal layer and a second metal layer connected to each other through a metal plug. FIG. 1 shows an example of the structure to be tested. As shown in FIG. 1, two metal interconnects 18 and 20 are connected with each other through a metal plug 17, and the test structure further comprises an insulation layer disposed between the structure to be tested and the heating plate for insulating both from one another. When the structure to be tested 16 is under a test, ends (such as F+, F−, S+, and S−) of metal interconnects 18 and 20 may be used for electric input/output.

FIGS. 1 to 3 show an embodiment in which the structure to be tested 16 comprises two metal interconnects connected to each other through a metal plug 17. However, the test structure according to the present invention may not only be utilized in the test for metal interconnects, but also may be utilized in the tests of time dependent dielectric breakdown (TDDB) and negative bias temperature instability (NBTI). That is, the structure to be tested 16 may be a structure of a patterned dielectric layer or a PMOS transistor.

In case the structure to be tested 16 is electrically conductive, an insulation layer 14 is preferably disposed between the heating plate 12 and the structure to be tested 16 for insulating one from the other. The insulation layer 14 may comprise dielectric material, for example, silicon oxide, silicon nitride, phosphosilicate glass (PSG), borophosphosilicate glass (BPSG), fluoride silicate glass (FSG), and the like, and particularly serve as an interlayer dielectric.

Figure 10:
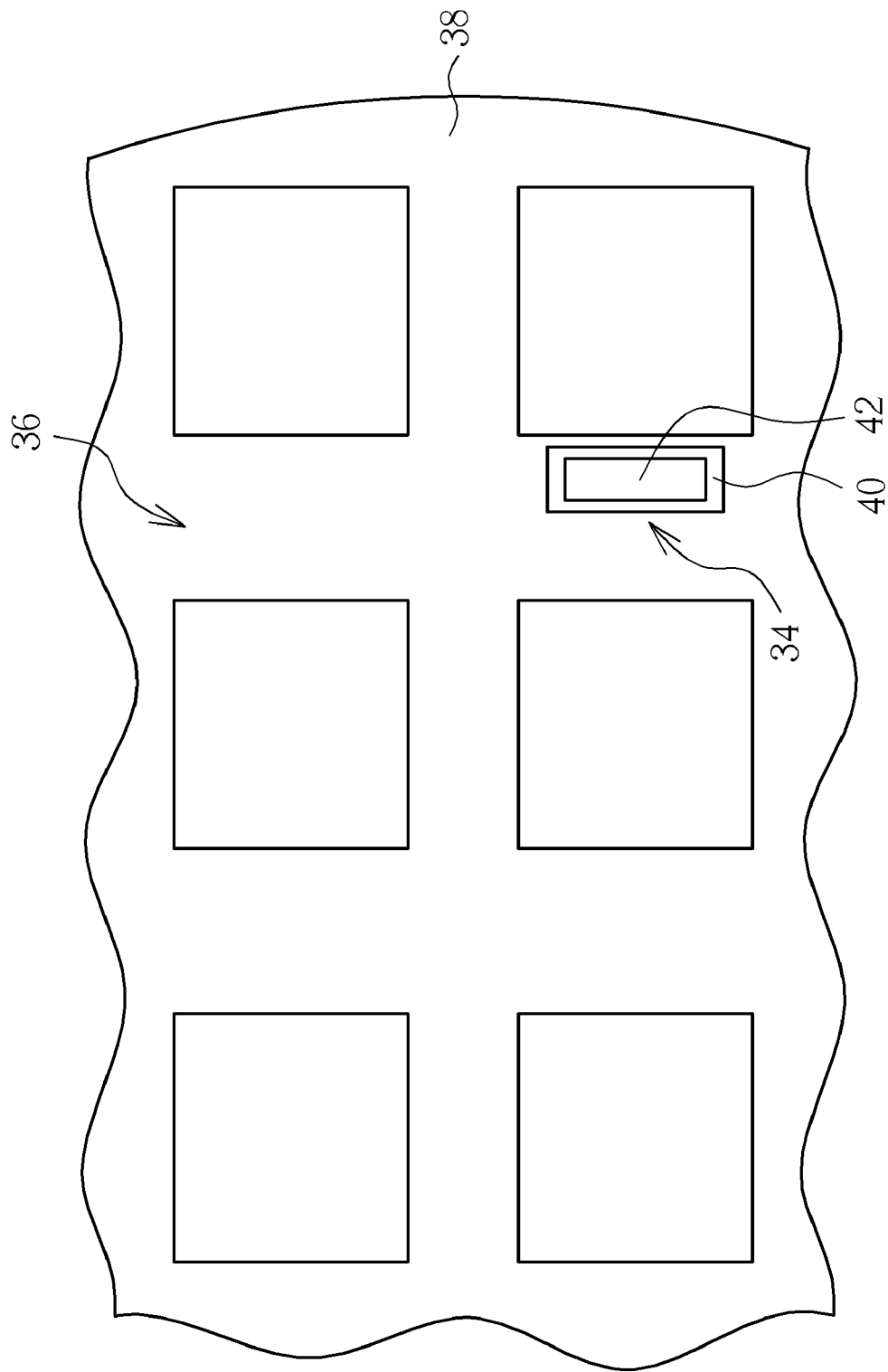
FIG. 10 is a schematic diagram showing that the test structure according to the present invention is formed on a scribe line of a wafer.

The test structure 10 according to the present invention may be formed on a wafer, and particularly on a scribe line of a wafer. In view of the above description, the test structure 10 may be made simultaneously with the semiconductor elements in the same manufacturing steps of a semiconductor manufacturing process and material used therein, without a need of additional steps or material. FIG. 10 schematically shows that the test structure 34 according to the present invention is formed on a scribe line 36 of a wafer 38. The test structure 34 includes a heating plate 40 formed on the scribe line 36 and a structure to be tested 42 on the heating plate 40.

In another aspect of the present invention, the wafer level test method comprises steps as follows. First, a heating plate is formed on a wafer. The heating plate is the same as the heating plate 12 aforesaid, which may be a polysilicon layer or a doped silicon layer. Next, a structure to be tested is formed above or adjacent to the heating plate. Thereafter, a voltage is applied to the heating plate thereby to heat the structure to be tested for performing a test.

The wafer level test method according to the present invention may be utilized in the tests such as electron migration, time dependent dielectric breakdown, negative bias temperature instability, and the like. That is, the structure to be tested may be a metal line structure, a dielectric layer, or a PMOS transistor.

The main principle of WLR-EM is that a conducting wire is conducted with a current that the current is far higher than a normal operating current, and a failure time of the conducting wire is measured at a predetermined temperature, for estimating the reliability of the conducting wire and the lifetime of product. With respect to a metal line, the following equation (1) is applicable:

$$R(T)=R_0\times[1+TCR\times(T-T_0)] \quad (1)$$

Wherein, R(T) is the resistance of the metal line at temperature T, $R_0$ is the resistance of the metal line at room temperature $T_0$ (25° C.), T is the metal line temperature, TCR is a thermal coefficient of resistance of the metal line and can be obtained from an experiment according to the equation (1). Therefore, if TCR of the metal line is known, the temperature of the metal line may be calculated from the resistance of the metal line, or the resistance of the metal line may be calculated from the temperature of the metal line.

Figure 5:
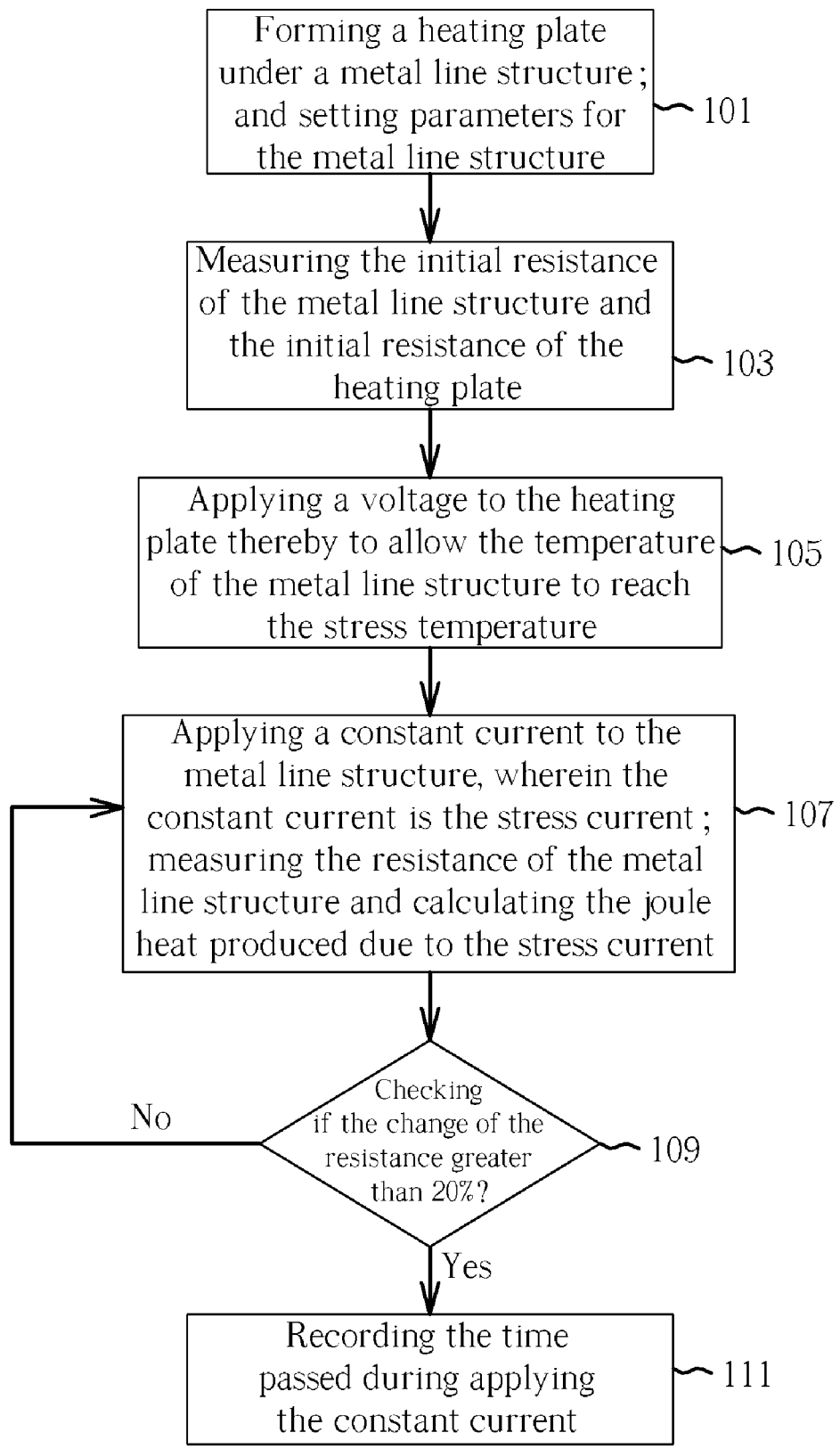
FIG. 5 is a flow chart showing the method for wafer level electron migration test for a metal line structure according to the present invention.

Accordingly, please refer to FIG. 5. FIG. 5 is a flow chart showing the method for wafer level electron migration test for a metal line structure according to the present invention. The method may include steps as follows. First, Step 101 is performed to form a heating plate under a metal line structure. The heating plate is the same as the heating plate 12 aforesaid, which may be for example a polysilicon layer or a doped silicon layer. Parameters for the metal line structure are set. The parameters include for example a thermal coefficient of resistance, a stress temperature, a stress current, and failure criteria. Thereafter, Step 103 is performed to measure the initial resistance of the metal line structure and the initial resistance of the heating plate. For example, Kevin structure may be used to measure four ends to obtain resistance. Subsequently, Step 105 is performed to apply a voltage to the heating plate thereby to allow the temperature of the metal line structure to reach the stress temperature. In the method of the present invention, the heating temperature may be as high as 410° C. When the test is carried out, the temperature may be calculated according to the equation (1) from the resistance of the heating plate (having a known TCR) measured at room temperature and the resistance at the test.

Subsequently, Step 107 is performed to apply a constant current (such as 10 mA) to the metal line structure. The constant current applied is the stress current. The resistance of the metal line structure is measured and the joule heat produced due to the stress current is calculated. The heat is incorporated into the temperature offered by the heating plate as described above, to obtain the temperature of the metal line structure, thereby the predetermined stress temperature can be reached. Alternatively, the temperature, that is, the test temperature, of the metal line structure can be calculated according to the equation (1) from the resistance of the metal line structure measured at room temperature and the resistance measured at the test. Step 109 is performed to check if the failure criteria are accomplished, for example, if the change of the resistance is greater than a predetermined value (for example, 20%), Step 111 is performed to stop applying the constant current to the metal line structure and the time passed during applying the constant current is recorded. If the change is not greater than the predetermined value, Step 107 is continued to apply the constant current to the metal line structure, until the change is greater than the predetermined value.

Figure 6:
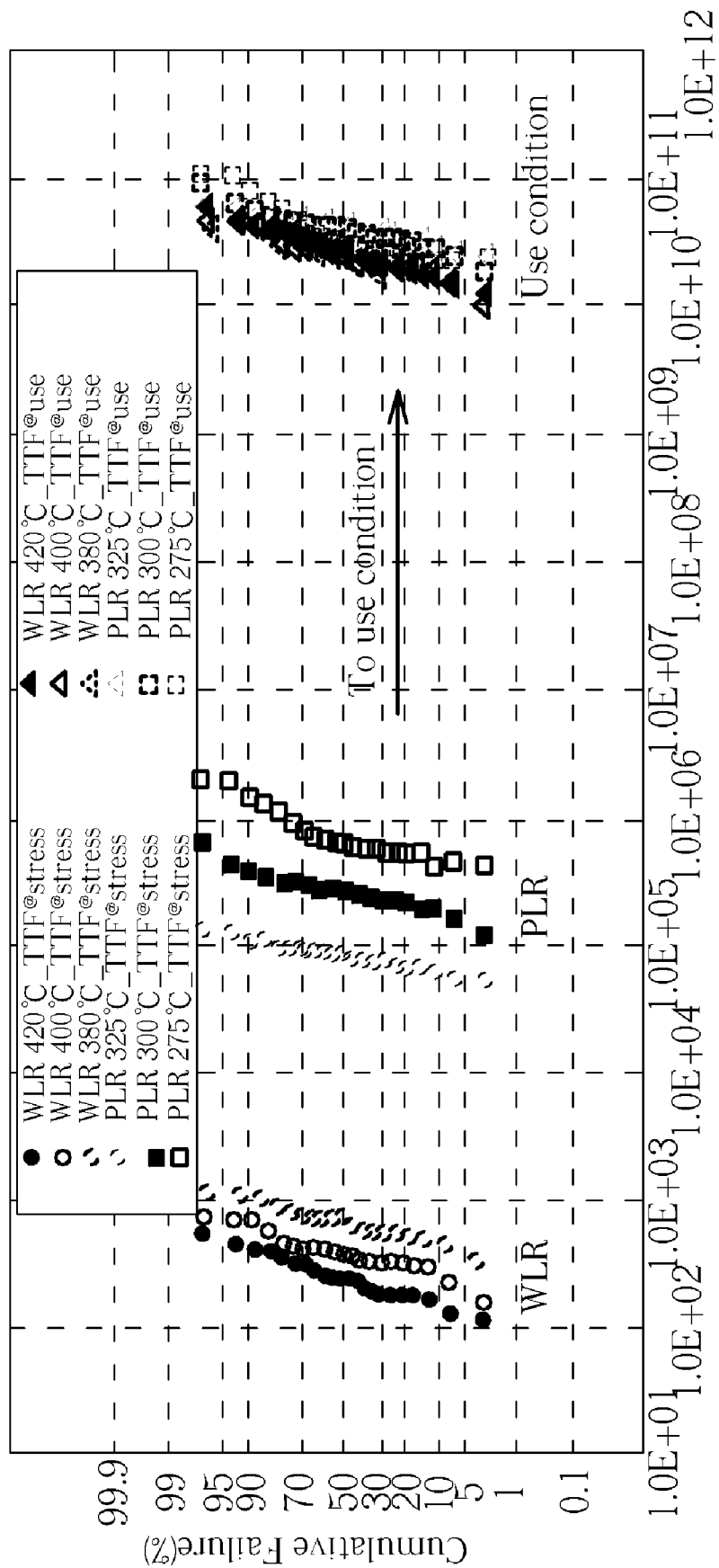
FIG. 6 is a plot of data showing the result of lifetime test obtained by the wafer level EM test method according to the present invention and the traditional PLR-EM test method.

The time passed for applying the stress current to the metal line structure until failure can be corresponding to a mean time to failure (MTTF), or referred to as "mean lifetime". MTTF means, with respected to a certain article, the average time or expected time for the certain article to be utilized or used in a proper environment until failure. For comparing the test result of the test method of the present invention with the test result of the traditional PLR-EM test to know if there is difference between them, test structures are formed on a wafer using the method of the present invention. Half of the samples on the wafer are tested for EM using the method of the present invention, and another half of the samples are tested using the traditional PLR-EM method. FIG. 6 is a plot of data showing the result of lifetime test obtained by the wafer level EM test method according to the present invention and the traditional PLR-EM test method. As it can be noted in view of the plot, the correlation is rather high. The life times of both are nearly the same.

Figure 7:
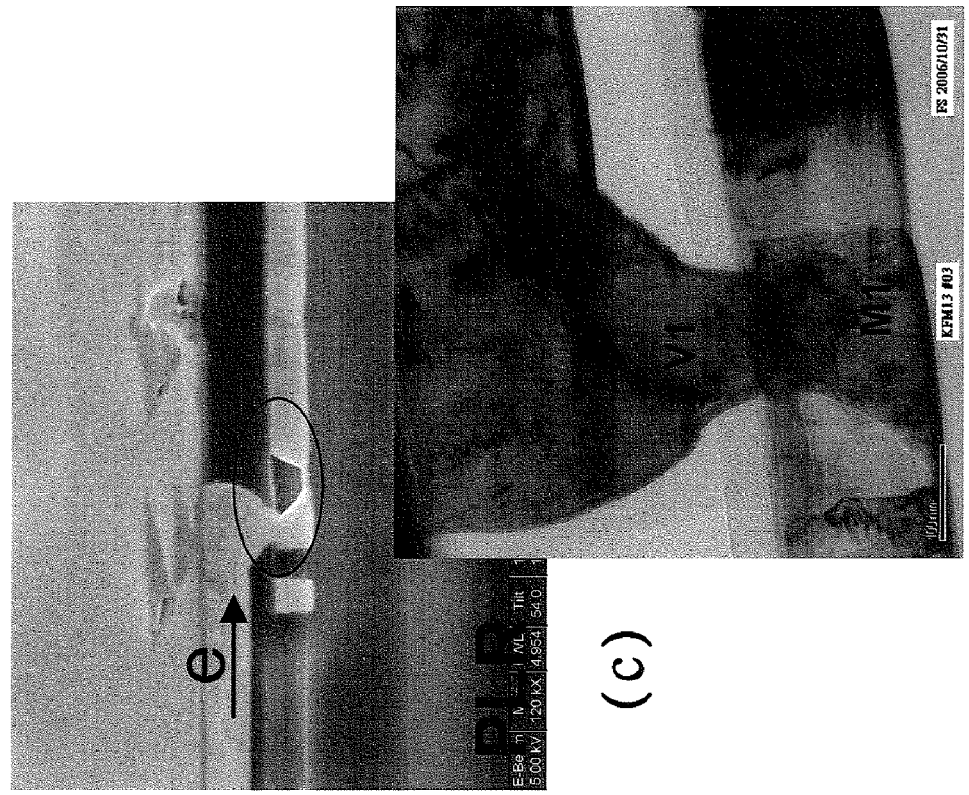
FIG. 7 shows microscopy photographs of samples after EM test in one embodiment according to the present invention and traditional technique respectively.
Figure 7:
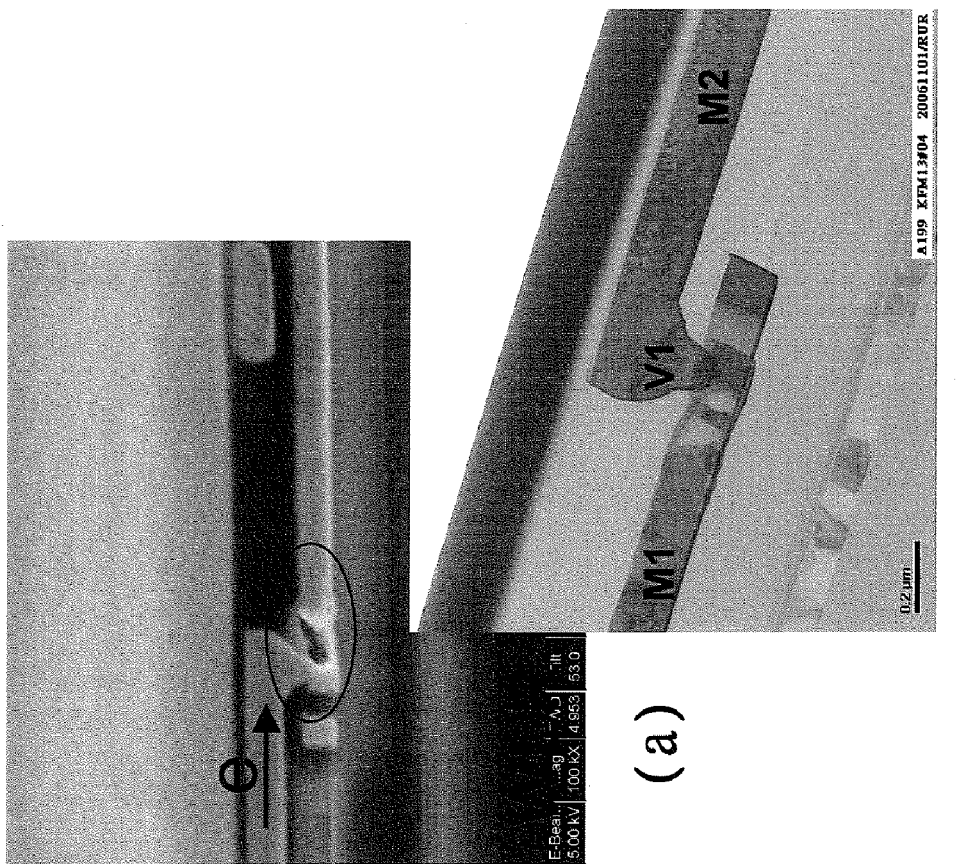

FIG. 7 shows micrographs of samples after EM test in one embodiment according to the present invention and traditional technique respectively. As shown in FIG. 7, (a) and (b) show respectively a focus ion beam microscopy (FIB) photograph a transmission electron microscopy (TEM) photograph obtained with respect to a sample subjected to a WLR-EM test according to the present invention. A void is found at the metal plug (V1) in a via for connecting two metal lines M1 and M2. The void is formed due to the flow (as shown by the arrow mark) of electrons (e), which is applied to the test structure when the test is performed. In FIG. 7, (c) and (d) show respectively a FIB photograph and a TEM photograph obtained with respect to a sample subjected to PLR-EM test. A void also exists at the metal plug. It indicates that the test results using the method of the present invention and the PLR method are substantially identical. However, it only takes 2 to 3 hours to use the test method of the present invention, and it takes about 2 to 3 weeks to finish the traditional PLR-EM test. Therefore, the test method of the present invention is a quite fast and efficient method of testing.

Figure 8:
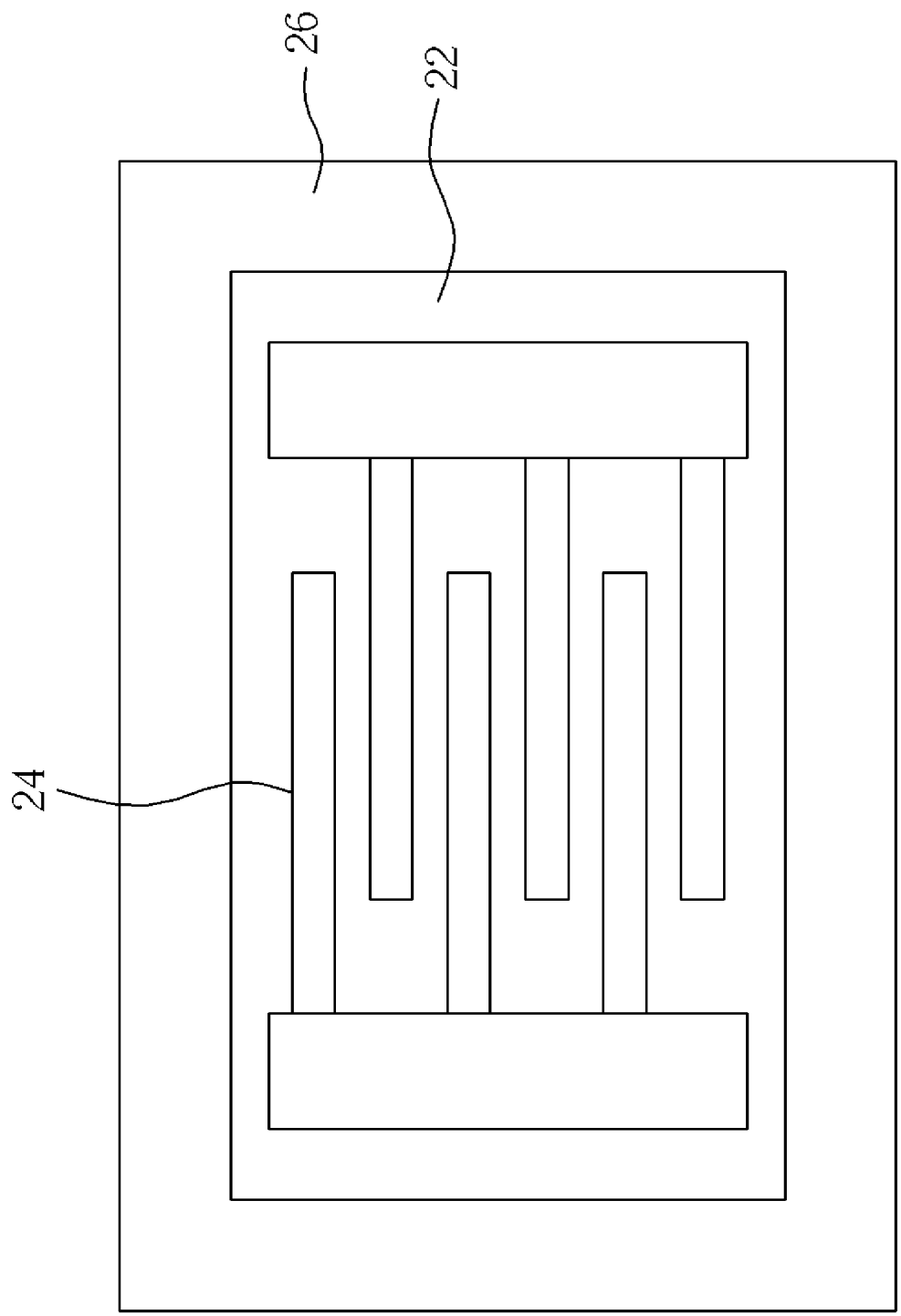
FIG. 8 is a schematic diagram of a test structure showing a utilization of the wafer level test method according to the present invention in a test of time dependent dielectric breakdown.

Please refer to FIG. 8. FIG. 8 is a schematic diagram of a test structure showing a utilization of the wafer level test method according to the present invention in a test of time dependent dielectric breakdown. The method of wafer level time dependent dielectric breakdown may include steps as follows. First, a heating plate 22 is formed under a patterned dielectric layer 24. The heating plate is the same as the heating plate 12 aforesaid, which may be a polysilicon layer or a doped silicon layer. The test structure may be formed when a semiconductor element is formed in a semiconductor manufacturing process, that is, a heating plate 22 is formed in the semiconductor substrate 26, and then the dielectric layer 24 is formed on the heating plate 22. As shown in FIG. 8, the dielectric layer 24 is an embodiment of a patterned dielectric layer. The pattern is two comb shapes facing to one another. Next, a voltage is applied to the heating plate 22 thereby to heat the patterned dielectric layer 24 to reach a temperature. A voltage is applied to the patterned dielectric layer 24 for an electric properties test, that is, the leakage current of the patterned dielectric layer is measured. Finally, the time passed during applying the voltage to the patterned dielectric layer 24 is recorded when the leakage current reaches a predetermined value. Thus, the properties and the reliability of the dielectric layer 24 can be obtained. The principle for the test may be already known, but heating the dielectric layer 24 using the heating plate 22 in the present invention is distinct.

Figure 9:
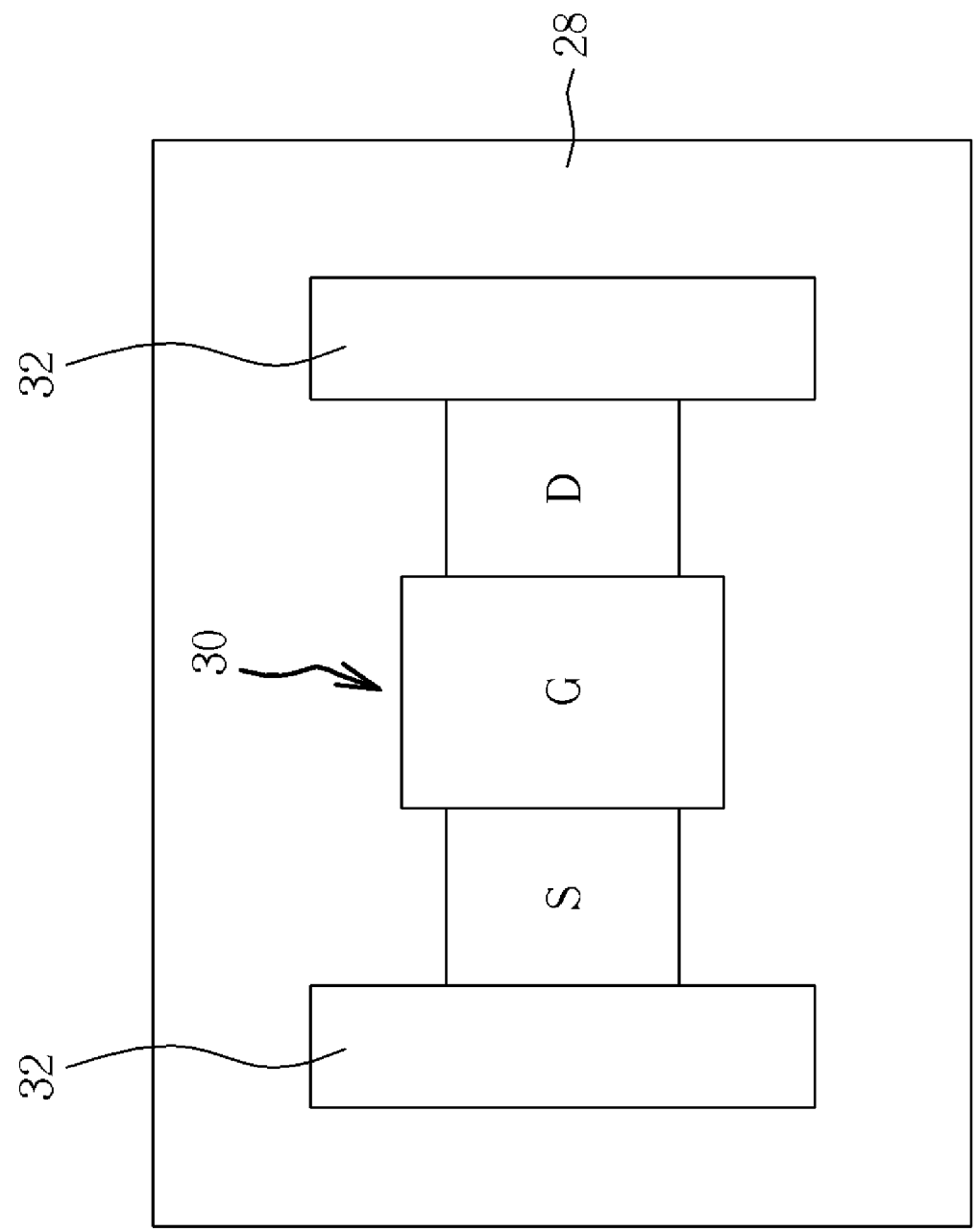
FIG. 9 is a schematic diagram of a test structure showing a utilization of the heating plate of the present invention as a heating device in a test of negative bias temperature instability.

Please refer to FIG. 9. FIG. 9 is a schematic diagram of a test structure showing a utilization of the heating plate of the present invention as a heating device in a test of negative bias temperature instability. The method may include the steps as follows. A PMOS transistor 30 is disposed on a semiconductor substrate 28 and has a gate (G), a source (S), and a drain (D). A heating plate 32 is formed adjacent to a source/drain. The heating plate 32 is the same as the heating plate 12 aforesaid, which may be a polysilicon layer or a doped silicon layer. The heating plate 32 may be formed simultaneously with the formation of the source/drain of the PMOS transistor 30. The heating plate is applied with a voltage, thereby to heat the source/drain to reach a stress temperature. A stress voltage is applied to the PMOS transistor. Thereafter, a change of initial resistance of the PMOS transistor is measured to test the negative bias temperature instability of the PMOS transistor.

Compared with the traditional techniques, the test structure and the wafer level test method according to the present invention have advantages as follows. The application of the stress temperature and the stress current can be independently controlled due to an independent heating plate. Though the test is carried out in a wafer level, the correlation between the lifetime of product obtained in the test according to the present invention and the lifetime of product obtained in the PLR test is good. In the method according to the present invention, the heat applied to the structure to be tested is from an independent outside heat source, and accordingly the failure mechanism is the same as that of the PLR carried out in an oven. The test time for the test method according to the present invention is short and is suitable for reliability control monitor (RCM).

All combinations and sub-combinations of the above-described features also belong to the present invention. Those skilled in the art will readily observe that numerous modifications and alterations of the device and method may be made while retaining the teachings of the invention.

What is claimed is:

1. A method for fabricating a test structure, comprising:
    forming a heating plate for heating a structure to be tested to perform a test upon a voltage being applied to the heating plate on a wafer; and
    forming the structure above or adjacent to the heating plate, wherein, the structure is for use in a semiconductor device, the heating plate comprises a polysilicon layer or a doped silicon layer,
    the structure comprises a first metal layer and a second metal layer connected to the first metal layer through a metal plug, and an insulation layer is further disposed between the structure and the heating plate for insulating both from one another.

2. The method for fabricating a test structure of claim 1, wherein the first metal layer is a first metal interconnect and the second metal layer is a second metal interconnect.

3. The method for fabricating a test structure of claim 1, wherein the heating plate is in a shape of a block, a spiral, a circle, or multi-stripes.

4. The method for fabricating a test structure of claim 1, wherein the heating plate is disposed on a scribe line of the wafer.

5. The method for fabricating a test structure of claim 1, wherein the polysilicon layer is further N-type doped or P-type doped.

6. The method for fabricating a test structure of claim 1, wherein the polysilicon layer comprises a metal polycide layer.

7. The method for fabricating a test structure of claim 1, wherein the metal polycide layer is further N-type doped or P-type doped.

8. The method for fabricating a test structure of claim 1, wherein the doped silicon layer is further N-type doped or P-type doped.

* * * * *